(12) United States Patent
Ohashi

(10) Patent No.: US 9,396,930 B2
(45) Date of Patent: Jul. 19, 2016

(54) SUBSTRATE PROCESSING APPARATUS

(71) Applicant: HITACHI KOKUSAI ELECTRIC INC., Tokyo (JP)

(72) Inventor: Naofumi Ohashi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/432,668

(22) PCT Filed: Dec. 27, 2013

(86) PCT No.: PCT/JP2013/085142
§ 371 (c)(1),
(2) Date: Mar. 31, 2015

(87) PCT Pub. No.: WO2015/097871
PCT Pub. Date: Jul. 2, 2015

(65) Prior Publication Data
US 2015/0294860 A1    Oct. 15, 2015

(51) Int. Cl.
*H01L 21/00* (2006.01)
*H01L 21/02* (2006.01)
*C23C 16/34* (2006.01)
*C23C 16/44* (2006.01)
*H01L 21/285* (2006.01)
*C23C 16/455* (2006.01)
(Continued)

(52) U.S. Cl.
CPC .......... *H01L 21/02274* (2013.01); *C23C 16/34* (2013.01); *C23C 16/44* (2013.01); *C23C 16/4412* (2013.01); *C23C 16/455* (2013.01); *C23C 16/45527* (2013.01); *C23C 16/46* (2013.01); *C23C 16/52* (2013.01); *H01L 21/02186* (2013.01); *H01L 21/02205* (2013.01); *H01L 21/02334* (2013.01); *H01L 21/285* (2013.01)

(58) Field of Classification Search
CPC ...... C23C 16/45; C23C 16/455; C23C 16/52; C23C 16/34; C23C 16/44; C23C 16/45527; C23C 16/4412; C23C 16/46
See application file for complete search history.

(56) References Cited

U.S. PATENT DOCUMENTS 6,238,588 B1 * 5/2001 Collins ............ H01L 21/31116
204/192.32
2006/0211246 A1    9/2006  Ishizaka et al.
2009/0035951 A1    2/2009  Miya et al.
(Continued)

FOREIGN PATENT DOCUMENTS

JP    H09-232290 A    9/1997
JP    2005-072490 A    3/2005
(Continued)

*Primary Examiner* — Richard Booth
(74) *Attorney, Agent, or Firm* — Volpe and Koenig, P.C.

(57) ABSTRACT

A substrate processing apparatus in which an improved film quality is obtained is disclosed. A precursor gas supply process of supplying a precursor gas to a process chamber while maintaining a substrate accommodated in the process chamber at a first temperature, a first removal process of removing the precursor gas remaining in the process chamber by supplying an inert gas, which is heated at a second temperature higher than the first temperature, to the process chamber, a reaction gas supply process of supplying a reaction gas to the process chamber, and a second removal process of removing the reaction gas remaining in the process chamber by supplying an inert gas to the process chamber are performed.

8 Claims, 8 Drawing Sheets

(51) Int. Cl.
*C23C 16/46* (2006.01)
*C23C 16/52* (2006.01)

(56) References Cited

U.S. PATENT DOCUMENTS

2009/0142491 A1  6/2009  Nakamura et al.
2014/0037846 A1* 2/2014  Lee .................. B05C 3/005
                                           427/255.28

FOREIGN PATENT DOCUMENTS

| JP | 2005-142355 A | 6/2005 |
| JP | 2007-039806 A | 2/2007 |
| JP | 2008-537979 A | 10/2008 |
| JP | 2009-049367 A | 3/2009 |
| JP | 2011-151294 A | 8/2011 |
| JP | 2011-159905 A | 8/2011 |

* cited by examiner

SUBSTRATE PROCESSING APPARATUS

TECHNICAL FIELD

The present disclosure relates to a method of manufacturing a semiconductor device which includes a process of forming a thin film on a substrate, a substrate processing apparatus, and a recording medium.

BACKGROUND

Recently, semiconductor devices such as a flash memory have a tendency of higher integration. Accordingly, sizes of patterns used in the semiconductor devices have been significantly miniaturized. When forming such patterns, as one process of a manufacturing process, a process of conducting a predetermined processing such as oxidizing or nitriding on a substrate may be performed.

SUMMARY

As one method of forming such patterns, there is a process of forming a groove between circuits and forming a liner film or a wiring therein. The groove is configured to have a high aspect ratio, according to the recent miniaturization trend.

The present disclosure is to provide a method of manufacturing a semiconductor device, a substrate processing apparatus, and a recording medium, which makes it possible to form a high quality thin film with a uniform film thickness on a substrate.

According to an embodiment of the present disclosure, there is provided a method of manufacturing a semiconductor device, including: (a) supplying a precursor gas to a substrate accommodated in a process chamber while maintaining the substrate at a first temperature; (b) supplying a first inert gas, which is heated at a second temperature higher than the first temperature, to the substrate; (c) supplying a reaction gas to the substrate; and (d) supplying a second inert gas to the substrate.

DETAILED DESCRIPTION

First Embodiment of the Present Disclosure

There is a process of forming a groove between circuits and forming a liner film or a wiring therein, when forming a miniaturized pattern. The groove is configured to have a high aspect ratio, according to the recent miniaturization trend. For example, as a method of forming the film, there is a method of supplying process gases as a plurality of precursors, which contribute to the film forming, on a substrate alternately by one gas to form a film on the substrate using an adsorption reaction and a surface reaction for the substrate.

In this method, for example, when a precursor gas or a reaction gas is used as a process gas, a temperature of a susceptor for supporting a substrate is set based on the reaction promoting temperature of any one of respective gases. In general, it is often set to match the reaction promoting temperature of a reaction gas. However, when the reaction promoting temperature of a reaction gas is higher than the pyrolysis temperature of the precursor gas, the precursor gas might be pyrolyzed before it is adsorbed to the substrate, thereby causing a problem that a film quality is deteriorated.

In order to improve the uniformity in the supply of gases and the processing speed, a common shower head for two types of gases may be used and a purge gas with a large flow rate may be flowed while each gas is supplied. However, in some cases, the shower head may be cooled down by the purge gas, thereby straying from an optimal process window with regard to temperature. Further, a buffer chamber of the shower head or the shower head dispersion plate may be cooled down to a temperature at which by-products are adhered. The adhered by-products may turn into particles and adversely affect the properties of a substrate. Furthermore, since the temperature of the buffer chamber or the shower head dispersion plate is lowered, it may stray from an optimal process window, thereby failing to obtain a desired film quality. The inventors have researched and figured out how to solve the problems above, as follows.

(1) Configuration of Substrate Processing Apparatus

Figure 1:
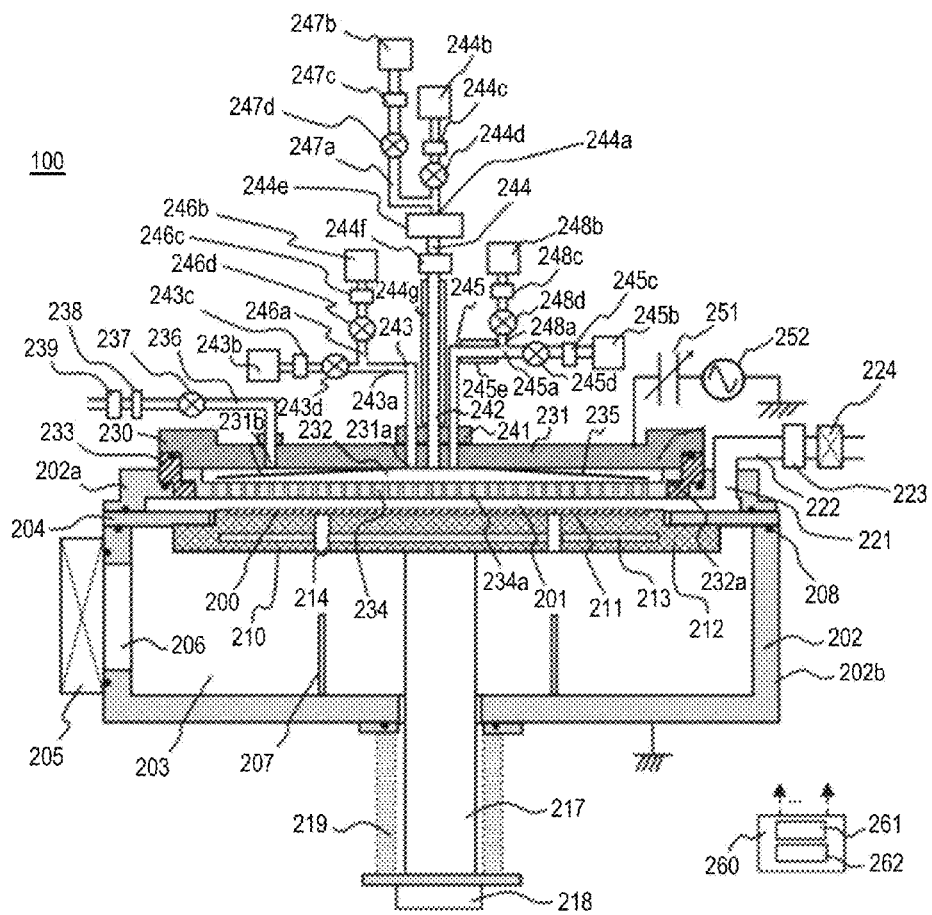
FIG. 1 is a sectional view illustrating a substrate processing apparatus according to a first embodiment of the present disclosure.

A substrate processing apparatus according to the first embodiment of the present disclosure will be described below using the drawings. FIG. 1 is a sectional view illustrating a substrate processing apparatus according to this embodiment.

A processing apparatus 100 according to this embodiment will be described. The substrate processing apparatus 100 is an apparatus for forming a thin film. As shown in FIG. 1, it is configured as a single-wafer type substrate processing apparatus configured to process a substrate one at a time.

As shown in FIG. 1, the substrate processing apparatus 100 is provided with a process vessel 202. For example, the process vessel 202 is configured as a flat airtight vessel having a circular cross section. In addition, the sidewall or the bottom wall of the process vessel 202 is made, for example, of metal, such as aluminum (Al) or stainless steel (SUS). A process chamber 201, in which a wafer 200 such as a silicon wafer as a substrate is processed, and a transfer space 203 are provided in the process vessel 202. The process vessel 202 includes an upper vessel 202a, a lower vessel 202b, and a shower head 230 serving as a ceiling part. A partition plate 204 is installed between the upper vessel 202a and the lower vessel 202b. A space above the partition plate 204 and surrounded by the upper vessel 202a and the shower head 230, is referred to as a process chamber space, and a space below the partition plate 204 and surrounded by the lower vessel 202b, is referred to as the transfer space. A structure configured by the upper process vessel 202a and the shower head 230 and surrounding a process space is referred to as the process chamber 201. Further, a structure surrounding the transfer space is referred to as a transfer chamber 203 in the process chamber. Between each structure, O-rings 208 for sealing the inside of the process vessel 202 are installed.

A substrate loading/unloading port 206 is installed adjacent to a gate valve 205 in a side surface of the lower vessel 202b, and the wafer 200 moves into and out of a transfer chamber (not shown) through the substrate loading/unloading port 206. A plurality of lift pins 207 are installed in a bottom portion of the lower vessel 202b. In addition, the lower vessel 202b is connected to a ground.

A substrate support 210 for supporting the wafer 200 is located inside the process chamber 201. The substrate support 210 includes a mounting surface 211 on which the wafer 200 is mounted, a substrate mounting table 212 having the mounting surface 211 on a surface thereof, and a heater 213 as a heating source contained in the substrate mounting table 212. Through holes 214 through which the lift pins 207 penetrate are formed at positions in the substrate mounting table 212 corresponding to the lift pins 207, respectively.

The substrate mounting table 212 is supported by a shaft 217. The shaft 217 penetrates through a bottom portion of the process vessel 202 and is also connected to an elevation mechanism 218 outside the process vessel 202. By operating the elevation mechanism 218 to raise or lower the shaft 217 and the substrate mounting table 212, the wafer 200 mounted on the substrate mounting surface 211 can be raised or lowered. In addition, a periphery of a lower end of the shaft 217 is covered with a bellows 219 so that an interior of the process vessel 202 is maintained airtight.

When the wafer 200 is transferred, the substrate mounting table 212 is lowered such that the substrate mounting surface 211 is located at a position of the substrate loading/unloading port 206 (wafer transfer position). Further, when the wafer 200 is processed, the substrate mounting table 212 is raised such that the wafer 200 is located at a processing position (wafer processing position) in the process chamber 201 as shown in FIG. 1.

Specifically, when the substrate mounting table 212 is lowered to the wafer transfer position, upper ends of the lift pins 207 protrude from the upper surface of the substrate mounting surface 211, and the lift pins 207 support the wafer 200 from below. In addition, when the substrate mounting table 212 is raised to the wafer processing position, the lift pins 207 are sunken from the upper surface of the substrate mounting surface 211, and the substrate mounting surface 211 supports the wafer 200 from below. Further, since the lift pins 207 may be in direct contact with the wafer 200, they may be formed, for example, of quartz, alumina or the like.

(Gas Introduction Port)

A gas introduction port 241 configured to supply various types of gases into the process chamber 201 is installed in an upper surface (ceiling wall) of a shower head 230, which will be described later. The shower head 230 is installed at an upper portion of the process chamber 201. A configuration of a gas supply system connected to the gas introduction port 241 will be described later.

(Shower Head)

Between the gas introduction port 241 and the process chamber 201, the shower head 230 as a gas dispersion mechanism communicating to the process chamber 201 is installed. The gas introduction port 241 is connected to a lid 231 of the shower head 230. The gas introduced from the gas introduction port 241 is supplied into a buffer space in a buffer chamber 232 of the shower head 230 through a hole 231a formed in the lid 231. The buffer chamber 232 is formed by the lid 231 and a dispersion plate 234, which will be described later.

The lid 231 of the shower head is formed of a conductive metal and used as an electrode for generating plasma in the buffer space of the buffer chamber 232 or in the process chamber 201. An insulation block 233 is installed between the lid 231 and the upper vessel 202a to insulate the lid 231 and the upper vessel 202a from each other. Further, a resistive heater 232a serving as a heating part of the shower head lid is installed in the lid 231.

The shower head 230 includes a dispersion plate 234, which is configured to disperse the gas introduced from the gas introduction port 241, between the buffer space and the process space of the process chamber 201. The dispersion plate 234 has a plurality of gas through holes 234a formed therein. The dispersion plate 234 is disposed to face the substrate mounting surface 211. The dispersion plate 234 has a convex part, in which the gas through holes 234a are formed, and a flange part provided around the convex part. The flange part is supported by the insulation block 233.

A gas guide 235 configured to form flow of the supplied gas is installed in the buffer chamber 232. The gas guide 235 has a conical shape having a diameter increasing from the hole 231a toward the dispersion plate 234. A horizontal diameter of a lower end of the gas guide 235 is formed such that the diameter extends to the outside of the outermost circumference of the group of the gas through holes 234a.

An exhaust pipe 236 is connected to the upper side of the buffer chamber 232 through an exhaust hole 231b for the shower head. A valve 237 configured to switch the exhaust on/off, a pressure adjuster 238 such as an auto pressure controller (APC) valve configured to control the interior of the exhaust buffer chamber 232 to a predetermined pressure, and a vacuum pump 239 are serially connected to the exhaust pipe 236 in this order.

Since the exhaust hole 231b is disposed at the upper side of the gas guide 235, a shower head exhaust process described later is configured such that gas flows as follows. The inert gas supplied from the hole 231a is dispersed by the gas guide 235 and flows toward the center and the lower side of the space of the buffer chamber 232. Then, the inert gas flows back from the end portion of the gas guide 235 and is exhausted from the exhaust hole 231b. Mostly, the exhaust pipe 236, the valve 237, and the pressure adjuster 238 are integrally referred to as a first exhaust system.

(Supply System)

A common gas supply pipe 242 is connected to the gas introduction port 241 connected to the lid 231 of the shower head 230. A first gas supply pipe 243a, a second gas supply pipe 244a, and a third gas supply pipe 245a are not connected to the common gas supply pipe 242. The second gas supply pipe 244a is connected to the common gas supply pipe 242 through a remote plasma unit 244e.

A first element-containing gas is mainly supplied from a first gas supply system 243 including the first gas supply pipe 243a, and a second element-containing gas is mainly supplied from a second gas supply system 244 including the second gas supply pipe 244a. An inert gas is mainly supplied from a third gas supply system 245 including the third gas supply pipe 245a when the wafer 200 is processed, and a cleaning gas is also mainly supplied form the third gas supply system 245 when the process chamber 201 is cleaned.

(First Gas Supply System)

A first gas supply source 243b, a mass flow controller (MFC) 243c serving as a flow rate controller (flow rate control part), and a valve 243d serving as an opening/closing valve, are installed in the first gas supply pipe 243a in this order from an upstream direction.

A gas containing a first element (hereinafter, referred to as "a first element-containing gas") is supplied to the shower head 230 from the first gas supply pipe 243a through the mass flow controller 243c, the valve 243d, and the common gas supply pipe 242.

The first element-containing gas, which is one of the process gases, is a precursor gas (source gas). For example, the first element is titanium (Ti). That is, the first element-containing gas is, for example, a titanium-containing gas. The titanium-containing gas may include, for example, a titanium tetrachloride (TiCl$_4$) gas. In addition, the first element-containing gas may be in any one of solid, liquid and gaseous states under normal temperature and pressure. When the first element-containing gas is in a liquid state under normal temperature and pressure, a vaporizer (not shown) has only to be installed between the first gas supply source 243b and the mass flow controller 243c. Here, a case in which the first element-containing gas is in a gaseous state will be described. Further, the titanium-containing gas acts as a precursor.

A downstream end of the first inert gas supply pipe 246a is connected to the first gas supply pipe 243a at a downstream side of the valve 243d. An inert gas supply source 246b, a mass flow controller (MFC) 246c, which is a flow rate controller (flow rate control part), and a valve 246d, which is an opening/closing valve, are installed in the first inert gas supply pipe 246a in this order from an upstream direction.

Here, the inert gas is, for example, a nitrogen (N$_2$) gas. In addition, the inert gas may include, for example, a rare gas, such as a helium (He) gas, a neon (Ne) gas, and an argon (Ar) gas, in addition to the N$_2$ gas.

An inert gas is supplied into the shower head 230 from the first inert gas supply pipe 246a through the mass flow controller 246c, the valve 246d, and the first gas supply pipe 243a. The inert gas acts as a carrier gas or a dilution gas in a thin film forming step S104 described later.

The first element-containing gas supply system 243 (also referred to as the first gas supply system, precursor gas (source gas) supply system, titanium-containing gas supply system) is configured by the first gas supply pipe 243a, the mass flow controller 243c, and the valve 243d.

Further, a first inert gas supply system is configured by the first inert gas supply pipe 246a, the mass flow controller 246c, and the valve 246d. In addition, the inert gas supply source 246b and the first gas supply pipe 243a may also be included in the first inert gas supply system.

Furthermore, the first gas supply source 243b and the first inert gas supply system may also be included in the first element-containing gas supply system.

(Second Gas Supply System)

The remote plasma unit 244e, a heater 244f as a heating means (heating system), and a temperature maintaining heater 244g are installed at a downstream side of the second gas supply pipe 244a. A second gas supply source 244b, a mass flow controller (MFC) 244c, which is a flow rate controller (flow rate control part), and a valve 244d, which is an opening/closing valve, are installed in an upstream side of the second gas supply pipe 244a in this order from an upstream direction.

A gas containing a second element (hereinafter, referred to as "a second element-containing gas") is supplied into the shower head 230 from the second gas supply pipe 244a though the mass flow controller 244c, the valve 244d, the remote plasma unit 244e, and the common gas supply pipe 242. The second element-containing gas may become a plasma state by the remote plasma unit 244e. Further, the second element-containing gas is heated to a temperature equal to or higher than a reaction promoting temperature or a pyrolysis temperature by the heater 244f, maintained at a temperature equal to or higher than the pyrolysis temperature by the temperature maintaining heater 244g, and supplied to the process chamber 201. As such, the second element-containing gas is supplied onto the wafer 200.

The second element-containing gas is one of the process gases. In addition, the second element-containing gas may serve as a reaction gas (reactant gas).

Here, the second element-containing gas contains the second element other than the first element. The second element is, for example, nitrogen (N). In this embodiment, the second element-containing gas is, for example, a nitrogen-containing gas. Specifically, an ammonia (NH$_3$) gas may be used as the nitrogen-containing gas.

The second element-containing gas supply system 244 (also referred to as the second gas supply system, reaction gas (reactant gas) supply system, or nitrogen-containing gas supply system) is configured by the second gas supply pipe 244a, the mass flow controller 244c, and the valve 244d.

In addition, a downstream end of the second inert gas supply pipe 247a is connected to the second gas supply pipe 244a at a downstream side of the valve 244d. An inert gas supply source 247b, a mass flow controller (MFC) 247c serving as a flow rate controller (flow rate control part), and a valve 247d serving as an opening/closing valve, are installed in the second inert gas supply pipe 247a in this order from an upstream direction.

An inert gas is supplied into the shower head 230 from the second inert gas supply pipe 247a through the mass flow controller 247c, the valve 247d, the second gas supply pipe 244a, and the remote plasma unit 244e. The inert gas acts as a carrier gas, a dilution gas, or a substrate heating gas in the thin film forming step S104 described later.

When acting as a heating gas, in a process chamber exhaust step described later, the inert gas is heated to a temperature equal to or higher than a pyrolysis temperature or a reaction promoting temperature of a reactant gas by the heater 244f. The heated inert gas is maintained at a temperature equal to or higher than the pyrolysis temperature or the reaction promoting temperature of the reactant gas by the temperature maintaining heater 244g, and supplied to the process chamber 201. As such, the inert gas is supplied onto the wafer 200.

A second inert gas supply system is configured with the second inert gas supply pipe 247a, the mass flow controller 247c, and the valve 247d. In addition, the inert gas supply source 247b, the second gas supply pipe 244a, and the remote plasma unit 244e may also be included in the second inert gas supply system.

Further, the second gas supply source 244b, the remote plasma unit 244e, and the second inert gas supply system may also be included in the second element-containing gas supply system 244.

(Third Gas Supply System)

A third gas supply source 245b, a mass flow controller (MFC) 245c serving as a flow rate controller (flow rate control part), and a valve 245d serving as an opening/closing valve, are installed in the third gas supply pipe 245a in this order from an upstream direction.

An inert gas as a purge gas is supplied to the shower head 230 from the third gas supply pipe 245a though the mass flow controller 245c, the valve 245d, and the common gas supply pipe 242.

Here, the inert gas is, for example, a nitrogen (N$_2$) gas. In addition, the inert gas may include, for example, a rare gas, such as a helium (He) gas, a neon (Ne) gas, and an argon (Ar) gas, in addition to the N$_2$ gas.

A downstream end of the cleaning gas supply pipe 248a is connected to the third gas supply pipe 245a at a downstream side of the valve 245d. A cleaning gas supply source 248b, a mass flow controller (MFC) 248c serving as a flow rate controller (flow rate control part), and a valve 248d serving as an opening/closing valve, are installed in the cleaning gas supply pipe 248a in this order from an upstream direction.

The third gas supply system 245 (referred to as a third inert gas supply system) is configured by the third gas supply pipe 245a, the mass flow controller 245c, and the valve 245d.

Further, a cleaning gas supply system is configured with the cleaning gas supply pipe 248a, the mass flow controller 248c and the valve 248d. In addition, the cleaning gas supply source 248b and the third gas supply pipe 245a may also be included in the cleaning gas supply system.

Furthermore, the third gas supply source 245b and the cleaning gas supply system may also be included in the third gas supply system 245.

In a substrate processing process, the inert gas is supplied into the shower head 230 from the third gas supply pipe 245a through the mass flow controller 245c, the valve 245d, and the common gas supply pipe 242. Further, in a cleaning process, the cleaning gas is supplied into the shower head 230 through the mass flow controller 248c, the valve 248d, and the common gas supply pipe 242.

In the thin film forming step S104 described later, the inert gas supplied from the third gas supply source 245b acts as a purge gas which purges the process chamber 202 or the shower head 230 to remove the gas remains therein. Further, in the cleaning process, the inert gas may act as a carrier gas or a dilution gas of the cleaning gas.

The cleaning gas supplied from the cleaning gas supply source 248b acts as a cleaning gas which removes by-products adhered to the shower head 230 or the process chamber 202 in the cleaning step.

Here, the cleaning gas is, for example, a nitrogen trifluoride (NF$_3$) gas. In addition, the cleaning gas may include, for example, a hydrogen fluoride (HF) gas, a chlorine trifluoride (ClF$_3$) gas, a fluorine (F$_2$) gas, and the like, or a combination thereof.

(Second Exhaust System)

An exhaust port 221 configured to exhaust an atmosphere of the process chamber 201 is formed in an upper surface of an inner wall of the process chamber 201 (the upper vessel 202a). An exhaust pipe 222 is connected to the exhaust port 221, and a pressure adjuster 223 such as an auto pressure controller (APC) configured to control the interior of the process chamber 201 to a predetermined pressure, and a vacuum pump 224 is serially connected to the exhaust pipe 222 in this order. A second exhaust system (exhaust line) is configured with the exhaust port 221, the exhaust pipe 222, and the pressure adjuster 223. In addition, the vacuum pump 224 may also be included in the second exhaust system.

(Plasma Generation Part)

The shower head lid 231 is connected to a matching unit 251 and a high frequency power source 252. By adjusting the impedance with the high frequency power source 252 and the matching unit 251, plasma is generated in the shower head 230 and the process chamber 201.

(Controller)

The substrate processing apparatus 100 includes a controller 260 configured to control the operations of respective parts of the substrate processing apparatus 100. The controller 260 includes at least a computing part 261 and a memory device 262. The memory device 262 is configured as, for example, a flash memory, a hard disc drive (HDD), or the like. A control program for controlling operations of the substrate processing apparatus or a process recipe, in which sequences or conditions for processing a substrate are written, is readably stored in the memory device 262. The sequences or conditions will be described later. Also, the process recipe functions as a program for the controller 260 to execute each sequence in the substrate processing process, which will be described later, to obtain a predetermined result. Hereinafter, the process recipe or control program may be generally referred to as a program. Also, when the term "program" is used herein, it may include a case in which only the process recipe is included, a case in which only the control program is included, or a case in which both the process recipe and the control program are included. In addition, a RAM (not shown) is configured as a memory area (work area) in which a program or data read by the computing part 261 is temporarily stored.

The controller is connected to the MFCs 243c, 244c, 245c, 246c, 247c, and 248c, the valves 237, 243d, 244d, 245d, 246d, 247d, and 248d, the gate valve 205, the matching unit 251, the high frequency power source 252, the heater 244f, the temperature maintaining heater 244g, the pressure adjuster 238, the APC valve 223, the vacuum pumps 239 and 224, and the elevation mechanism 218 described above. The controller 260 is configured to call a program or a control recipe of the substrate processing apparatus from the memory device according to instructions from a higher controller or a user, so as to control the flow rate adjustment operations of various gases by the MFCs 243c, 244c, 245c, 246c, 247c, and 248c, opening/closing operations of the valves 237, 243d, 244d, 245d, 246d, 247d, 248d, and the gate valve 205, control of the matching unit 251, control of the high frequency power source 252, temperature adjustment operations of the heater 244f and the temperature maintaining heater 244g, opening/closing operations of the pressure adjuster 238 and the APC valve 223, pressure adjust operations by the pressure adjuster 238 and the APC valve 223, the start and stop of vacuum pumps 239 and 224, elevation operations of the shaft 217 and the mounting table 212 by the elevation mechanism 218, and the like.

(2) Substrate Processing Process

Figure 2:
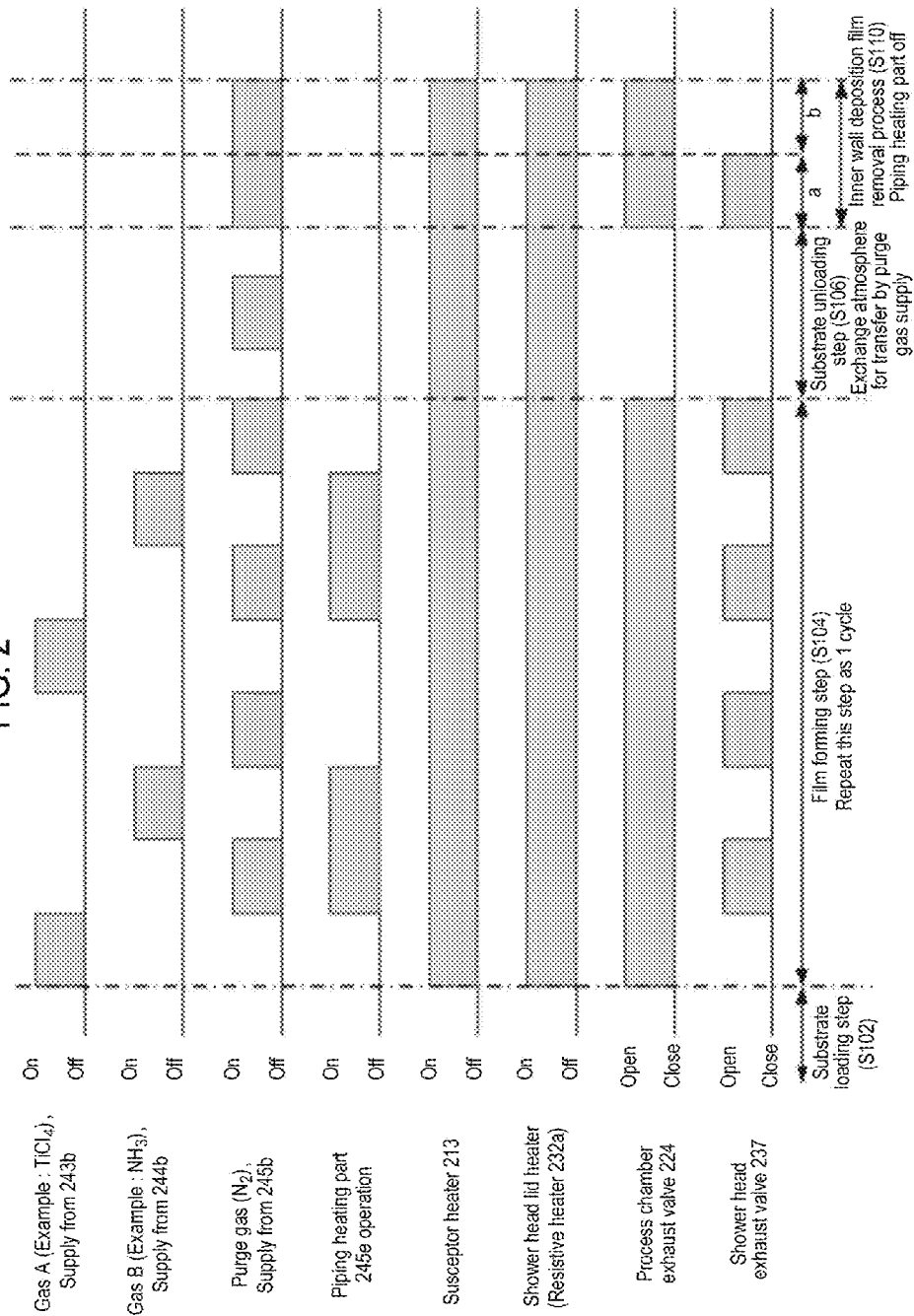
FIG. 2 is a view for explaining the operation of each part in a substrate processing process according to the first embodiment of the present disclosure.
Figure 3:
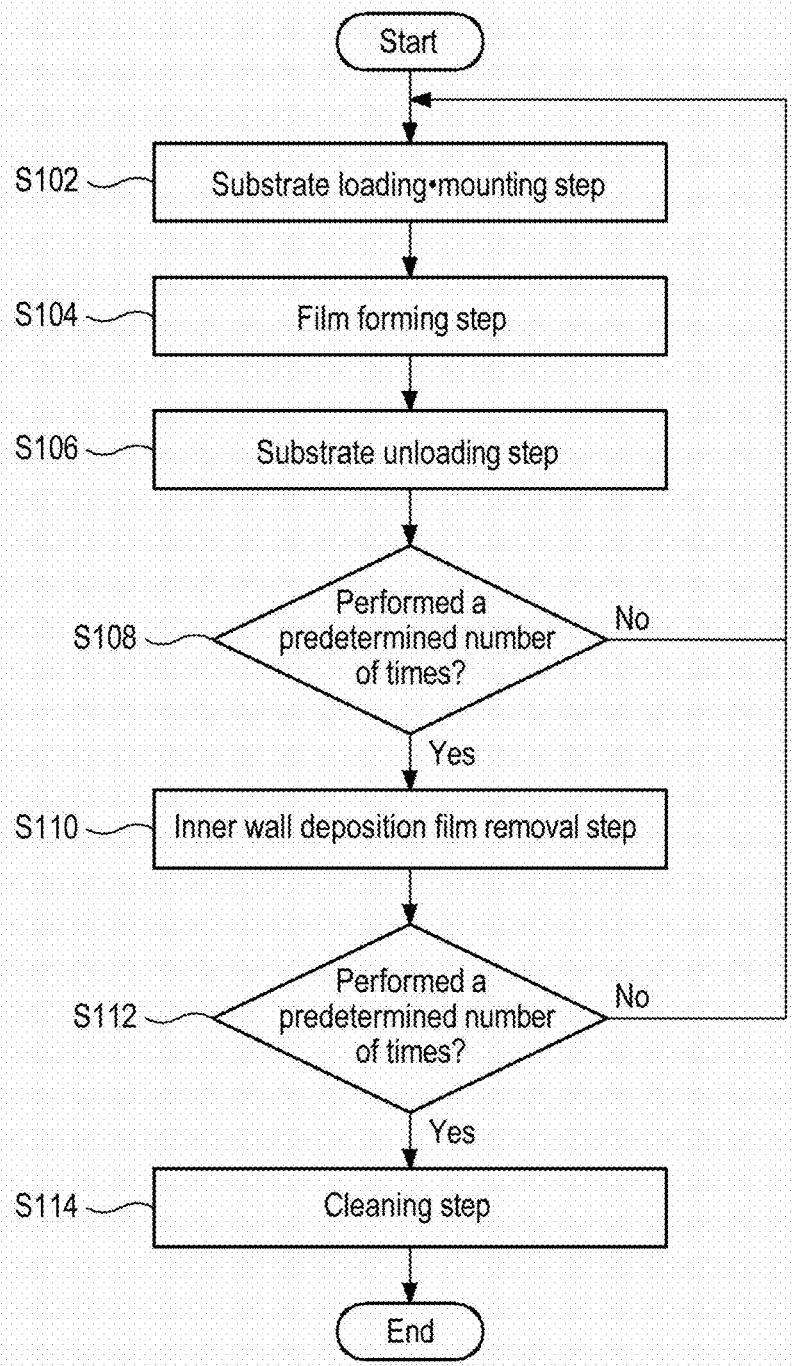
FIG. 3 is a flowchart illustrating a substrate processing process according to the first embodiment of the present disclosure.
Figure 4:
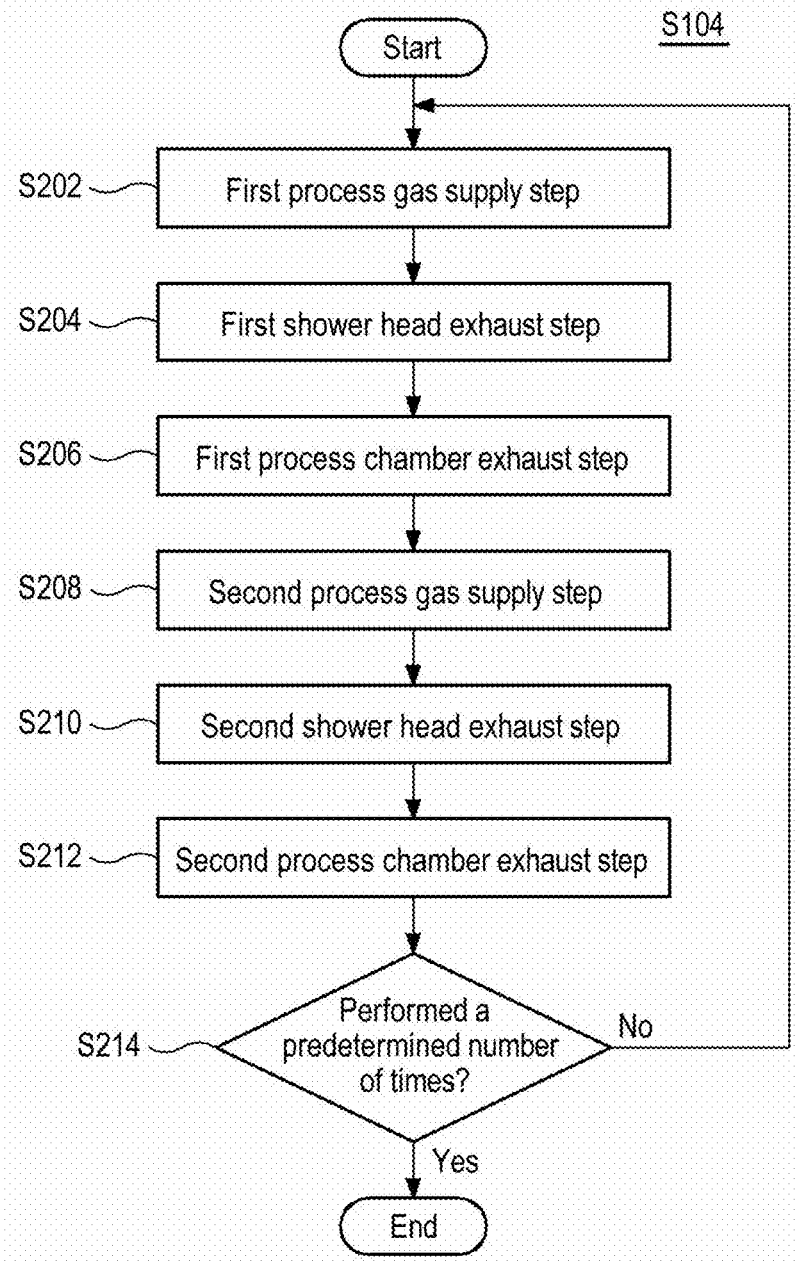
FIG. 4 is a flowchart illustrating the details of a film forming step S104 in FIG. 3.

Next, a process of forming a thin film on the wafer 200 using the substrate processing apparatus 100 will be described with reference to FIGS. 2 to 4. FIG. 2 is a view for explaining the operation of each part in a substrate processing process. FIG. 3 is a flowchart illustrating a substrate processing process according to an embodiment of the present disclosure. FIG. 4 is a flowchart of a film forming step S104 according to an embodiment of the present disclosure. Further, in the descriptions that follow, operations of respective parts that constitute the substrate processing apparatus 100 are controlled by the controller 260.

Here, an example of forming a titanium nitride film as a thin film on the wafer 200, by using a TiCl$_4$ gas as the first element-containing gas and an ammonia (NH$_3$) gas as the second element-containing gas, will be described. Further, for example, a predetermined film may be formed in advance on the wafer 200. In addition, a predetermined pattern may be formed in advance in the wafer 200 or the predetermined film.

(Substrate Loading—Mounting Step S102)

In the processing apparatus 100, the substrate mounting table 212 is lowered to the transfer position of the wafer 200, and thereby the through holes 214 of the substrate mounting table 212 are penetrated by the lift pins 207. As a result, the lift pins 207 are in a state where they protrude from a surface of the substrate mounting table 212 by a predetermined height. Next, the gate valve 205 is opened, the wafer 200 (processing substrate) is loaded into the process chamber by using a wafer transfer device (not shown), and the wafer 200 is transferred onto the lift pins 207. Accordingly, the wafer 200 is supported in a horizontal position above the lift pins 207 that protrude from the surface of the substrate mounting table 212.

When the wafer 200 is loaded into the process vessel 202, the wafer transfer device is moved outside of the process vessel 202, and the gate valve 205 is closed to make the interior of the process vessel 202 airtight. Then, the wafer 200 is mounted on the substrate mounting surface 211 provided on the substrate mounting table 212 by raising the substrate mounting table 212.

Further, when the wafer 200 is loaded into the process vessel 202, a $N_2$ gas as an inert gas may be supplied from the inert gas supply system into the process vessel 202 while the process vessel 202 is exhausted by the exhaust system. That is, the $N_2$ gas may be supplied into the process vessel 202 by opening at least the valve 245d of the third gas supply system, in a state where the interior of the process vessel 202 is exhausted by operating the vacuum pump 224 to open the APC valve 223. Accordingly, it is possible to minimize the amount of particles entering into the process vessel 202 or the adhesion of particles onto the wafer 200. Further, the vacuum pump 224 is made in a working condition all the time, at least from the substrate loading•mounting step S102 to when a substrate unloading step S106, which will be described later, is terminated.

In addition, when the wafer 200 is mounted on the substrate mounting table 212, power is supplied to the heater 213 that is buried inside the substrate mounting table 212, and the surface of the wafer 200 is controlled to be at a predetermined temperature. At this time, the temperature of the heater 213 is adjusted by controlling a power on/off state for the heater 213 based on temperature information detected by a temperature sensor (not shown).

(Film Forming Step S104)

Next, the thin film forming step S104 is performed. A basic flow of the thin film forming step S104 will be described, and features of this embodiment will be described in detail later.

In the thin film forming step S104, a $TiCl_4$ gas is supplied into the process chamber 201 through the buffer chamber 232 of the shower head 230. Accordingly, a titanium-containing layer is adsorbed onto the wafer 200. After the $TiCl_4$ gas is supplied and a predetermined time has passed, the supply of the $TiCl_4$ gas is stopped. Then, the $TiCl_4$ gas is discharged from the buffer chamber 232 and the process chamber 201 by the purge gas. When the purge gas is supplied to the process chamber, it is heated to a desired temperature by a piping heating part 245e, so as not to cool down the dispersion plate 234, and so as to raise the temperature of the wafer 200.

After discharging the $TiCl_4$ gas, a $NH_3$ gas activated by plasma excitation is supplied into the process chamber 201 through the buffer chamber 232. The $NH_3$ gas reacts with the titanium-containing layer adsorbed on the wafer 200 to form a titanium nitride film. After a predetermined time has passed, the supply of the $NH_3$ gas is stopped, and a purge gas in an unheated state is supplied into the process chamber 201 to discharge the remaining $NH_3$ gas from the shower head 230 and the process chamber 201.

In the film forming step S104, a titanium nitride film of a desired film thickness is formed by repeating the above process. In addition, during the film forming step, the resistive heater 232a of the shower head lid heats the buffer chamber 232 to prevent, as far as possible, by-products from adhering to the inner wall of the buffer chamber 232.

(Substrate Unloading Step S106)

Next, the substrate mounting table 212 is lowered to have the wafer 200 supported on the lift pins 207 that protrude from the surface of the substrate mounting table 212. Then, the gate valve 205 is opened, and the wafer 200 is unloaded to the outside of the process vessel 202 using the wafer transfer device. Then, in the case of terminating the substrate processing process, the supplying of the inert gas from the third gas supply system into the process vessel 202 is stopped.

(Processing Times Determination Step S108)

After the substrate is unloaded, it is determined whether the thin film forming step has been performed a predetermined number of times. If it is determined that the thin film forming step has been performed the predetermined number of times, the process proceeds to an inner wall deposition film removal step. If it is determined that the thin film forming step has not been performed the predetermined number of times, the process proceeds to the substrate loading•mounting step S102 in order to start processing of the next waiting wafer 200.

(Inner Wall Deposition Film Removal Step S110)

In the film forming step S104, the buffer chamber 232 was heated to prevent by-products from adhering to the inner wall of the buffer chamber 232. However, depending on the stacking of gases or the amount of gases, the by-products are adhered to the inner wall of the buffer chamber 232. In this step, after the processing times determination step S108, a deposition film due to the by-products, which is adhered to the buffer chamber 232 or the dispersion plate 234 during the film forming step S104, is removed. The details of the removal step will be described later.

(Processing Times Determination Step S112)

After a substrate is unloaded, it is determined whether the inner wall deposition film removal step has been performed a predetermined number of times. If it is determined that the inner wall deposition film removal step has been performed the predetermined number of times, the process proceeds to a cleaning step. If it is determined that the inner wall deposition film removal step has been performed the predetermined number of times, the process proceeds to the substrate loading•mounting step S102 in order to start a processing of the next waiting wafer 200.

(Cleaning Step S114)

In the processing times determination step S108, if it is determined that the thin film forming step has been performed a predetermined number of times, a cleaning step of the interior of the process chamber 201 and the shower head 230 is performed. Here, the valve 248d of the cleaning gas supply system is opened, and a cleaning gas is supplied to the process chamber 201 through the shower head 230.

If the shower head 230 and the process chamber 201 are filled with the cleaning gas, the high frequency power source 252 applies power and concurrently the matching unit 251 performs an impedance matching, so as to generate the plasma of the cleaning gas in the shower head 230 and the process chamber 201. The generated cleaning gas plasma may be used to remove by-products adhered to the walls inside the shower head 230 and the process chamber 201.

Subsequently, the details of the film forming step S104 will be described using FIG. 4.

(First Process Gas Supply Step S202)

If the wafer 200 of the substrate mounting surface 211 is heated to reach a desired first temperature, the valve 243d is opened, the $TiCl_4$ as a first process gas starts to be supplied into the process chamber 201 through the gas introduction port 241, the buffer chamber 232, and the plurality of through holes 234a. The TiCl$_4$ gas is uniformly dispersed by the gas guide 235 in the buffer chamber 232. The uniformly dispersed gas is uniformly supplied onto the wafer 200 in the process chamber 201 through the plurality of through holes 234a. At this time, the wafer 200 is maintained at the first temperature. Here, the first temperature is a temperature that is higher than the condensation temperature of the TiCl$_4$ gas and is lower than the temperature at which a substantive pyrolysis begins, and for example, it is a constant value of 100 degrees C. or more to 300 degrees C. or less. This is because a pyrolysis of the TiCl$_4$ gas may substantively begin, and Cl and the like may infiltrate into the film, thereby possibly deteriorating the distribution within the film surface. The first temperature may be 200 degrees C. in some examples.

At this time, the mass flow controller 243c is adjusted such that the flow rate of the TiCl$_4$ gas is set to a predetermined flow rate. In addition, the supply flow rate of the TiCl$_4$ is adjusted to, for example, a value of 100 sccm or more to 5,000 sccm or less. Further, along with the TiCl$_4$ gas, a N$_2$ gas as a carrier gas may flow from the first inert gas supply system. In addition, the exhaust pump 224 is operated to adjust the valve opening level of the APC valve 223 appropriately, thereby setting the internal pressure of the process vessel 202 to a predetermined pressure.

The TiCl$_4$ gas supplied into the process chamber 201 is supplied onto the wafer 200. Above the surface of the wafer 200, the TiCl$_4$ gas contacts the wafer 200, thereby forming a titanium-containing layer as "a first element-containing layer."

After a predetermined time has passed, the valve 243d is closed to stop the supply of the TiCl$_4$ gas.

(First Shower Head Exhaust Step S204)

After the supply of the TiCl$_4$ gas is stopped, while the valve 244d is in a closed state, the valve 247c is opened and the valve 245d is opened to exhaust the atmosphere in the shower head 230. At this time, the vacuum pump 239 is operated in advance. An inert gas supplied from the second inert gas 247b is heated by the heater 244f, and supplied to the process chamber 201. Further, an inert gas supplied from the third gas supply source 245b is heated by the heater 245e to a second temperature higher than the first temperature above, and supplied to the shower head 230 and the process chamber 201. The substrate 200 is heated by the supplied inert gas approximately to the reaction promoting temperature of the NH$_3$ gas activated by plasma excitation, which is the second element-containing gas. The first element-containing layer formed on the surface of the heated substrate 200 is in a state where impurities contained in the first element-containing gas are easily desorbed. Here, the second temperature is, higher than the first temperature, identical to the reaction promoting temperature of the NH$_3$ gas as a reaction gas, or lower than that. For example, the second temperature falls within a range of above 100 degrees C. to 600 degrees C. or less, specifically in a range of 200 degrees C. or more to 500 degrees C. or less, more specifically in a range of 400 degrees C. or more to 430 degrees C. or less. The second temperature may be set to 400 degrees C. in some examples. The second temperature is a value determined based on the reaction promoting temperature of the NH$_3$ gas or the required properties of semiconductor devices where the formed film applies. Here, it is understood that the reaction of the NH$_3$ gas is further promoted in a temperature range of about 350 degrees C. or more to 600 degrees C. or less, and in addition, considering the thermal tolerance of semiconductor devices, more specifically, the second temperature is approximately above 100 degrees C. to 430 degrees C. or less.

At this time, the opening/closing of the valve 237 and the vacuum pump 239 are controlled such that an exhaust conductance from the first exhaust system in the buffer chamber 232 is higher than a conductance of the exhaust pump 244 via the process chamber. By adjusting as above, a gas flow is formed from the center of the buffer chamber 232 toward the shower head exhaust hole 231b. In this way, gas adhered to the wall of the buffer chamber 232 or gas floating in the buffer space is exhausted from the first exhaust system without entering into the process chamber 201.

(First Process Chamber Exhaust Step S206)

After a predetermined time has passed, while continuously operating the exhaust pump 224 of the second exhaust system, the valve opening level of the APC valve 223 and the valve opening level of the valve 237 are adjusted such that an exhaust conductance from the second exhaust system in the process space is higher than an exhaust conductance from the first exhaust system via the shower head 230. By adjusting as above, a gas flow is formed toward the second exhaust system via the process chamber 201. Accordingly, it is possible to supply the inert gas, which is supplied to the buffer chamber 232, certainly onto a substrate, thereby raising the removal efficiency of a remaining gas on a substrate. In addition, at this time as well, the inert gas is heated to exhaust the interior of the process chamber 201.

The inert gas supplied in the process chamber exhaust step may be used to remove the unreacted TiCl$_4$ gas or the TiCl$_4$ gas after contributing to the formation of the titanium-containing layer, which remains in the process chamber 201, from above the wafer 200. Further, the valve 237 is opened, and the pressure adjuster 238 and the vacuum pump 239 are controlled to remove the remaining TiCl$_4$ gas in the shower head 230. After a predetermined time has passed, the valve 245d is closed to stop the supply of the inert gas, and concurrently the valve 237 is closed to isolate the shower head 230 and the vacuum pump 239.

After a predetermined time has passed, it is desirable to close the valve 237 while continuously operating the exhaust pump 224 of the second exhaust system in some examples. In such a way, since the flow toward the second exhaust system via the process chamber 201 is not affected by the first exhaust system, it is possible to supply the inert gas more certainly onto a substrate, thereby further raising the removal efficiency of the remaining gas on the substrate.

In addition, by performing the first process chamber exhaust step S206 subsequently after the first shower head exhaust step S204, the following effect can be found. That is, since the remnants in the buffer chamber 232 are removed in the shower head exhaust step S204, even if a gas flows through over the wafer 200 in the process chamber exhaust step S206, it is possible to prevent the remaining gas from adhering onto the substrate.

(Second Process Gas Supply step S208)

After the first process chamber exhaust step, the valve 244d is opened, and a NH$_3$ gas as a nitrogen-containing gas is supplied into the process chamber 201 through the gas introduction port 241, the buffer chamber 232, and the plurality of through holes 234a. Since the NH$_3$ gas is supplied to the process chamber through the buffer chamber 232 and the through holes 234, the NH$_3$ gas can be supplied uniformly on the substrate. Accordingly, it is possible to obtain a uniform film thickness. At this time, the NH$_3$ gas, which is a reaction gas, is heated by the heater 244e to a third temperature higher than the first temperature. For example, the third temperature falls within a range of room temperature to 600 degrees C., specifically within a range of 350 degrees C. to 500 degrees C., more specifically in a range of 400 degrees C. to 430 degrees C. The third temperature may be set to 400 degrees C. in some examples. The third temperature is a value determined based on the reaction promoting temperature of the $NH_3$ gas or the required properties of semiconductor devices where the formed film applies. Here, it is understood that the reaction of the $NH_3$ gas is further promoted in a temperature range of about 350 to 600 degrees C., and in addition, considering the thermal tolerance of semiconductor devices, more specifically, the third temperature may be set approximately from room temperature to 430 degrees C. The second temperature and the third temperature may be different temperatures or the same temperature.

At this time, the mass flow controller 244c is adjusted such that the flow rate of the $NH_3$ gas is set to a predetermined flow rate. In addition, the supply flow rate of the nitrogen gas is, for example, 100 sccm or more to 5,000 sccm or less. Further, along with the $NH_3$ gas, a $N_2$ gas as a carrier gas may be flowed from the second inert gas supply system. In addition, by adjusting the valve opening level of the APC valve 223 appropriately, the internal pressure of the process vessel 202 is set to a predetermined pressure.

The $NH_3$ gas activated by plasma excitation is supplied onto the wafer 200. The titanium-containing layer, which is already formed, and the $NH_3$ gas activated by plasma excitation are reacted to form, for example, a titanium nitride layer including a titanium element and a nitrogen element on the wafer 200.

After a predetermined time has passed, the valve 244d is closed to stop the supply of the $NH_3$ gas.

As such, the substrate is heated shortly before supplying the $NH_3$ gas, which is the second process gas described later, and thereby the following effects can be derived. The time of a reaction gas supply step can be shortened by setting in advance the $NH_3$ gas to the temperature at which a reaction is easily promoted. Meanwhile, without such process, if it is raised to a reaction promoting temperature during the reaction gas supply step, more time may be spent as compared to the present disclosure.

Further, the $NH_3$ gas, which is the second process gas, is heated in advance, thereby facilitating the desorption of impurities in the film. On the contrary, without such process, if the gas is raised to a reaction promoting temperature during the reaction gas supply step, the reaction gas may react on the impurities before reaching a desired temperature, and it is formed into a capped state such that the impurities are not desorbed. As a result, in the case of an electrode forming process, a film resistance value is increased, which leads to an increase in a wet etch rate in the process of forming an insulating film or a sacrifice film. For example, as in this embodiment, if a titanium nitride film is formed with the $TiCl_4$ gas, which is a precursor gas, and the $NH_3$ gas, which is a reaction gas, Cl of the $TiCl_4$ gas remains as impurities. In the next reaction gas supply step, since a substrate temperature is lower than the reaction promoting temperature of the reaction gas, the reaction with Cl that is remaining in the film is weak. Therefore, it is impossible to remove Cl. Further, in a state where Cl cannot be removed, the substrate temperature is increased and N and Ti are combined in the course thereof. As a result, Cl remains in the film. However, there is no such case in the present disclosure.

(Second Shower Head Exhaust Step S210)

After the supply of the $NH_3$ gas is stopped, the valve 237 is opened to exhaust the atmosphere in the shower head 230. Specifically, the atmosphere in the buffer chamber 232 is exhausted. At this time, a heated purge gas is supplied from the third gas supply system 245 to exhaust the atmosphere in the buffer chamber 232, while maintaining the temperature of the dispersion plate 234. It will be described in detail later regarding the second shower head exhaust step S210.

The opening/closing of the valve 237 and the vacuum pump 239 are controlled such that the exhaust conductance from the first exhaust system in the buffer chamber 232 is higher than the conductance of the exhaust pump 244 via the process chamber. By adjusting as above, a gas flow is formed from the center of the buffer space 232 toward the shower head exhaust hole 231b. In such a way, a gas adhered to the wall of the buffer chamber 232 or a gas floating in the buffer space is exhausted from the first exhaust system without entering into the process chamber 201.

(Second Process Chamber Exhaust Step S212)

After a predetermined time has passed, while operating the exhaust pump 224 of the second exhaust system, the valve opening level of the APC valve 223 and the valve opening level of the valve 237 are adjusted such that the exhaust conductance from the second exhaust system in the process space is higher than the exhaust conductance from the first exhaust system via the shower head 230. By adjusting as above, a gas flow is formed toward the second exhaust system via the process chamber 201. Accordingly, it is possible to supply the inert gas, which is supplied to the buffer chamber 232, certainly onto a substrate, thereby raising the removal efficiency of a remaining gas above the substrate.

The inert gas supplied in the process chamber exhaust step removes a titanium component, which could not combine with the wafer 200 in the first process gas supply step S202, from above the wafer 200. Further, the valve 237 is opened, and the pressure adjuster 238 and the vacuum pump 239 are controlled to remove the remaining oxygen gas in the shower head 230. After a predetermined time has passed, the valve 246d is closed to stop the supply of the inert gas, and concurrently the valve 237 is closed to isolate the shower head 203 and the vacuum pump 239.

More preferably in some embodiments, after a predetermined time has passed, it is desirable to close the valve 237 while continuously operating the exhaust pump 224 of the second exhaust system. In this way, since the flow of a remaining gas or the supplied inert gas in the buffer chamber 232 toward the second exhaust system via the process chamber 201 is not affected by the first exhaust system, it is possible to supply the inert gas more certainly onto a substrate, thereby further raising the removal efficiency of a remaining gas, which could not react with the first gas entirely, above the substrate.

In addition, by performing the process chamber exhaust step S206 subsequently after the shower head exhaust step S204, the following effect can be found. That is, since the remnants in the buffer chamber 232 are removed in the shower head exhaust step S204, even if a gas flows through over the wafer 200 in the process chamber exhaust step S206, it is possible to prevent the remaining gas from adhering onto the substrate.

(Determination S214)

In the meantime, the controller 260 determines whether the steps S202 to S212 as one cycle are performed a predetermined number of times.

If it is not performed a predetermined number of times ("NO" in S214), the cycle of the first process gas supply step S202, the first shower head exhaust step S204, the first process chamber exhaust step S206, the second process gas supply step S208, the second shower head exhaust step S210, and the second process chamber exhaust step S212 is repeated. If it is performed a predetermined number of times ("YES" in S214), the film forming step S104 is terminated.

Next, the details of the inner wall deposition film removal step S110 shown in FIG. 2 will be described.

After the film forming processing for the substrate 200 is terminated, and the substrate is discharged from the process chamber 201, the inner wall deposition film removal step S110 is performed. The susceptor heater 213 and the resistive heater 232a serving as a shower head lid heater, may continuously maintain an ON state. The shower head exhaust valve 237 and the process chamber exhaust valve 224 are opened to supply an $N_2$ gas as a purge gas from the third gas supply source 245b. At this time, the controller 260 as a control part may control the shower head exhaust valve 237 and the process chamber exhaust valve 224 such that the exhaust amount of the shower head 230 is higher than the exhaust amount of the process chamber 201, thereby preventing the atmosphere of the shower head 230 from flowing into the process chamber 201.

Here, the piping heating part 245e of the purge gas is maintained in an off state and is in a state where the purge gas is not heated. Due to a thermal stress generated by a temperature difference between the supplied purge gas and the process chamber inner wall, the film deposited on the process chamber inner wall may be exfoliated. The exfoliated film is exhausted from the exhaust pipe 236. Since the exhaust amount is controlled by the controller 260 such that the exhaust amount of the shower head 230 is higher than the exhaust amount of the process chamber 201, the exfoliated film within the shower head 230 would not be supplied to the holes 234a of the dispersion plate 234. Therefore, it is enabled that the holes 234a are not clogged by the exfoliated film.

If sufficient time has passed so that most of the exfoliated film is removed and exhausted from the exhaust pipe 236, the shower head exhaust valve 237 is closed. By such closing, a flow of the purge gas is made from the buffer chamber 232 toward the process chamber 201. Since the purge gas passes through dispersion plate holes 234a from the buffer chamber 232 in the shower head 230, the purge gas exfoliates the adhered matters within the dispersion plate holes 234a as pushing them toward the process chamber 201 side from the dispersion plate holes 234a. The pushed out adhered matters are exhausted from the process chamber exhaust system (the second exhaust system). At this time, more specifically, the susceptor heater 213 is turned on. By turning on the susceptor heater, the dispersion plate 234 is heated, and thereby a temperature difference from the purge gas is made further significant. That is, thermal stress further increases. Accordingly, the adhered matters in the dispersion plate holes 234a can be exfoliated more easily.

Second Embodiment

Figure 5:
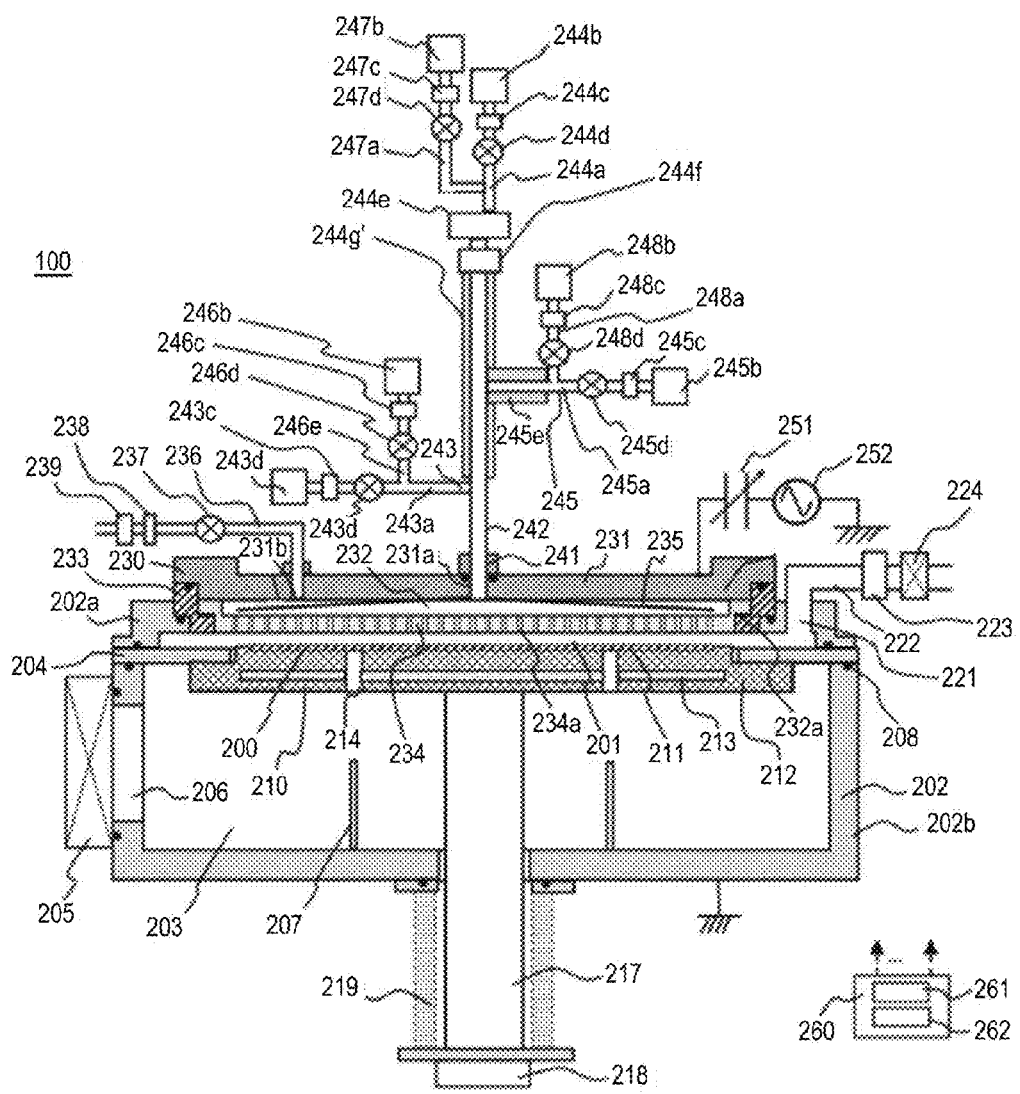
FIG. 5 is a sectional view illustrating a substrate processing apparatus according to a second embodiment of the present disclosure.

Next, a second embodiment of the present disclosure will be described using FIG. 5. Here, the parts different from the first embodiment will be described and descriptions of the parts identical to the first embodiment are omitted appropriately. As shown in FIG. 5, in this embodiment, the first gas supply system 243, the second gas supply system 244, and the third gas supply system 245 are combined and connected to the common gas supply pipe 242.

In the first shower head exhaust step S204 and the first process chamber exhaust step S206 in the first embodiment, the $N_2$ gas as a purge gas is heated by the heater 245e and supplied. In the second process gas supply step S208 configured to supply a reaction gas into the process chamber 201, the reaction gas is heated by the heater 244f and supplied to the process chamber 201. Since a precursor gas flows in the common gas supply pipe 242 from the precursor gas supply source 243b source 243b, it may not be desirable to heat the common gas supply pipe 242 itself. Due to such configuration, there is a concern that the temperature of the reaction gas heated by the heater 244f might decrease in the common gas supply pipe 242.

However, in this embodiment, in the first shower head exhaust step S204 and the first process chamber exhaust step S206, since the purge gas heated by a heater 244g' is supplied so that the common gas supply pipe is heated in advance, the heated reaction gas can be supplied into the process chamber 201 without lowering the temperature of the heated reaction gas.

Third Embodiment

Figure 6:
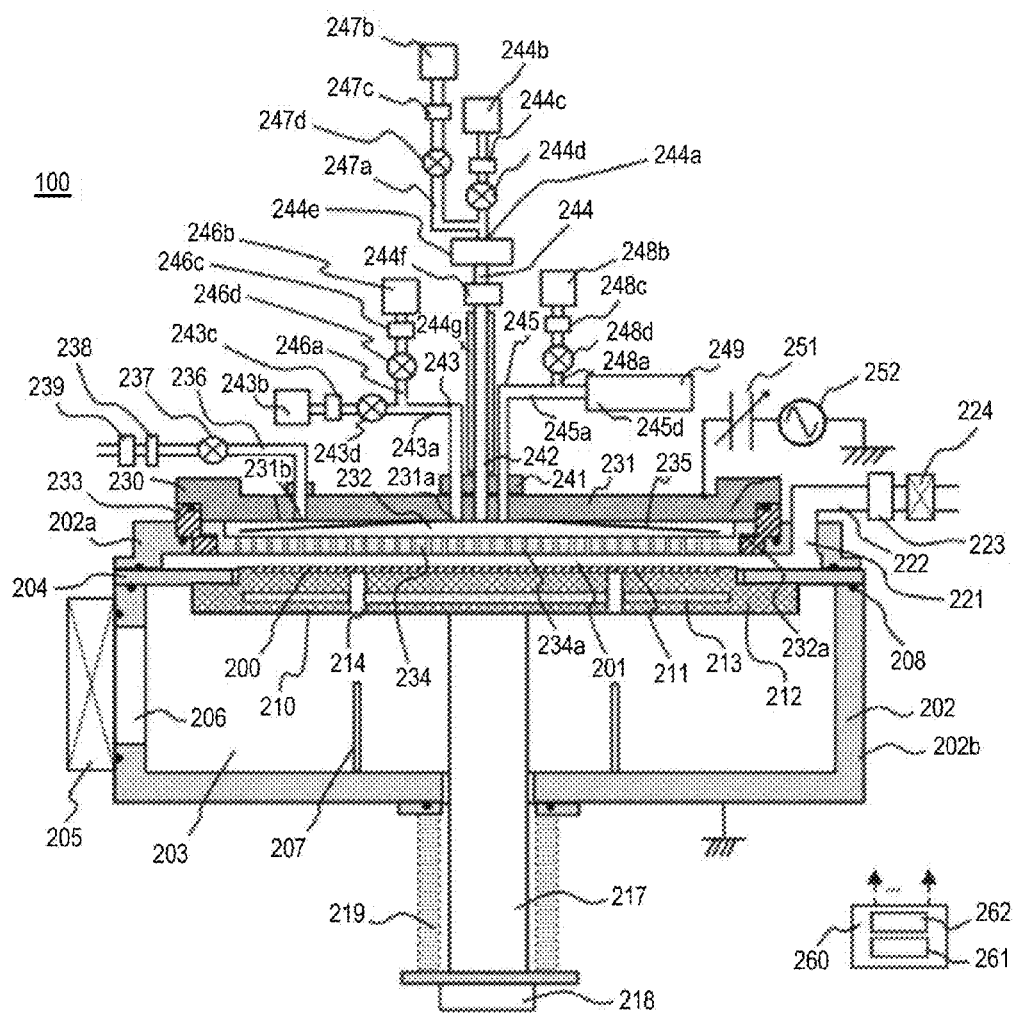
FIG. 6 is a sectional view illustrating a substrate processing apparatus according to a third embodiment of the present disclosure.
Figure 7:
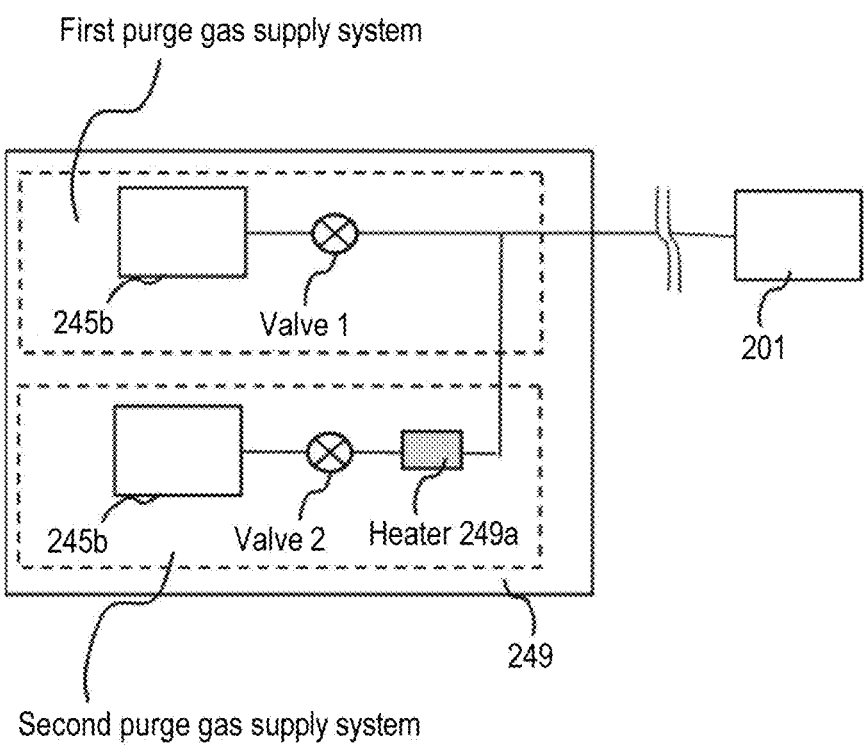
FIG. 7 is a schematic view illustrating a configuration of an inert gas supply part 249 of the substrate processing apparatus according to the third embodiment of the present disclosure.

Next, a third embodiment of the present disclosure will be described. Here, the parts different from the first embodiment will be described and descriptions of the parts identical to the first embodiment are omitted appropriately. FIG. 6 is a sectional view illustrating a substrate processing apparatus according to the third embodiment. FIG. 7 is a schematic view illustrating the configuration of inert gas supply part 249, which is a feature of this embodiment.

The inert gas supply part 249 is divided into a first purge gas supply system and a second purge gas supply system. The inert gas supply part 249 is configured to install a heater in a purge gas supply pipe of any one of the systems. In this embodiment, a heater 249a is installed in the second purge gas supply system. In a first purge gas supply step of this embodiment, a valve 1 of the first purge gas supply system is open, and a valve 2 is closed to supply an $N_2$ gas, which is an inert gas, as a purge gas, into the process chamber 201 without heating the gas. In the second process gas supply step S208, the valve 1 of the first purge gas supply system is closed, the valve 2 of the second purge gas supply system is opened, and a purge gas is heated by the heater 249a and supplied into the process chamber 201. In addition, in this embodiment, while the first purge gas supply system and the second purge gas supply system are configured to supply gas to the process chamber 201 through one common supply pipe, the present disclosure is not limited thereto, and the first purge gas supply system and the second purge gas supply system may be configured to independently supply gas to the process chamber.

Fourth Embodiment

Figure 8:
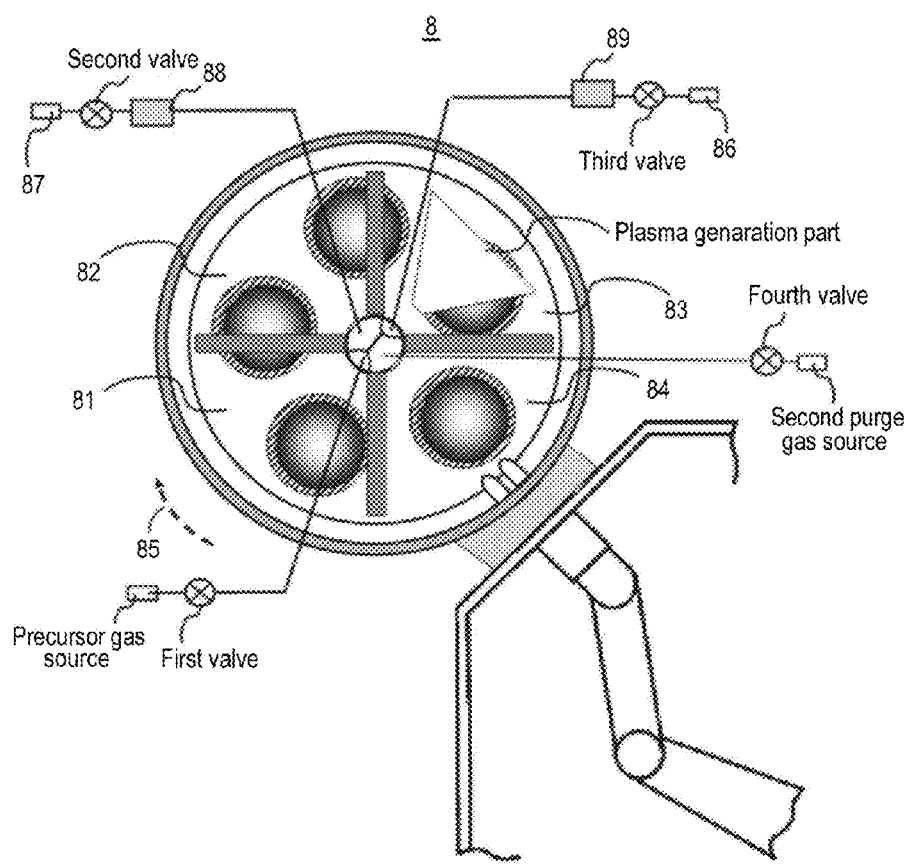
FIG. 8 is a sectional view illustrating a substrate processing apparatus according to a fourth embodiment of the present disclosure.

Next, a fourth embodiment of the present disclosure will be described. Here, the parts different from the first embodiment will be described and descriptions of the parts identical to the first embodiment are omitted appropriately. This embodiment can be implemented, as shown in FIG. 8, in a batch-type apparatus 8 where a plurality of substrates are arranged and processed at a time. The batch type apparatus 8 includes a precursor gas supply region 81 configured to supply a precursor gas to a substrate, a first purge region 82 configured to purge (remove) a precursor gas from above the substrate, a reaction gas supply region 83 configured to supply a reaction gas to the substrate, and the second purge region 84 configured to purge (remove) a reaction gas from above the substrate which are arranged in this order in a susceptor rotation direction 85 in which the susceptor rotates. The batch type apparatus 8 may be a substrate processing apparatus where heating heaters 88 and 89 are installed in each of a reaction gas supply part 86 configured to supply a gas in the reaction gas supply region 83 and a first purge gas supply part 87 configured to supply a purge gas to the first purge region 82.

The heater 88 is installed in a supply system configured to supply a purge gas to the first purge gas supply region 82, which is installed in an upstream of the susceptor rotation direction 85 of the reaction gas supply region 83 that is configured to generate plasma. Further, the heater 89 is installed in a supply system configured to supply a reaction gas to the reaction gas supply region 83. According to such configuration, similarly to the first embodiment, it is possible to heat the substrate in the first purge region 82 and the reaction gas supply region 83 and to lower the substrate temperature in the second purge region 84.

According to the present disclosure, it is possible to prevent straying from an optimal process window with regard to temperature, and in addition, to suppress the buffer chamber of the shower head or the shower head dispersion plate from cooling down to a temperature at which by-products may be adhered. Further, it is possible to suppress that the adhered by-products turning to particles adversely affect the properties of a substrate. Furthermore, since it is prevented that the temperature of a buffer chamber or a shower head dispersion plate is lowered, an improved film quality can be obtained without straying from an optimal process window.

The controller 260 (manipulation unit) according to the embodiments of the present disclosure is not configured by a dedicated system but may be realized using a general computer system. For example, by installing a program for executing the above-described processing in a general-purpose computer from a recording medium (flexible disk, CD-ROM, USB memory, and the like) in which the program is stored, the controller which performs the above-described processing may be configured.

Further, a means for providing such program (for example, an installer) is arbitrary. Other than providing the program through a predetermined recording medium as described above, for example, the program may be provided through a communication line, a communication network, a communication system or the like. In this case, for example, the program may be posted on a bulletin board of the communication network, and provided through the network by superimposing it to a carrier wave. Then, the above-described processing may be performed by starting the program provided as above and executing the program under control of an operating system (OS) in the same manner as another application program.

In addition, while the embodiments of the present disclosure have been described with respect to an example, where the $NH_3$ gas as the second element-containing gas is activated by plasma excitation and used, the present disclosure is not limited to the above-described embodiment, and for example, it is possible to use the gas by heating only without conducting the activation by plasma excitation. In that case, the reaction can be promoted by heating and using the $NH_3$ gas at a temperature of, for example, 600 degrees C. or the like, which is higher than the heating temperature for conducting the activation by plasma excitation. It is possible to select the above respectively, according to the properties (heat resistance) of a semiconductor device in which the titanium nitride film after the film forming is used.

Hereinabove, the embodiments of the present disclosure have been specifically described, but the present disclosure is not limited to the above-described embodiments and may be variously modified without departing from the spirit of the present disclosure.

<Aspects of Present Disclosure>

Hereinafter, some aspects of the present disclosure will be additionally stated.

<Supplementary Note 1>

According to an aspect of the present disclosure, there is provided a method of manufacturing a semiconductor device, including: a precursor gas supply process of supplying a precursor gas to a process chamber while maintaining a substrate accommodated in the process chamber at a first temperature; a first removal process of removing the precursor gas remaining in the process chamber by supplying an inert gas, which is heated at a second temperature higher than the first temperature, to the process chamber; a reaction gas supply process of supplying a reaction gas to the process chamber; and a second removal process of removing the reaction gas remaining in the process chamber by supplying an inert gas to the process chamber.

<Supplementary Note 2>

In the method of manufacturing a semiconductor device according to Supplementary Note 1, in the second removal process, the inert gas is supplied to the process chamber while being maintained at a temperature lower than the second temperature.

<Supplementary Note 3>

In the method of manufacturing a semiconductor device according to Supplementary Note 1, in the reaction gas supply process, the reaction gas is supplied to the process chamber while being heated at a third temperature higher than the first temperature.

<Supplementary Note 4>

In the method of manufacturing a semiconductor device according to Supplementary Note 3, in the second removal process, the inert gas is supplied to the process chamber while being maintained at a temperature lower than the third temperature.

<Supplementary Note 5>

In the method of manufacturing a semiconductor device according to Supplementary Note 3, the second temperature is equal to the third temperature.

<Supplementary Note 6>

In the method of manufacturing a semiconductor device according to Supplementary Note 3, the third temperature is equal to or higher than a pyrolysis temperature of the reaction gas.

<Supplementary Note 7>

According to an aspect of the present disclosure, there is provided a substrate processing apparatus, including: a process chamber configured to accommodate a substrate; a precursor gas supply system configured to supply a precursor gas to the process chamber; a reaction gas supply system configured to supply a reaction gas to the process chamber; an inert gas supply system having an inert gas supply pipe connected to the process chamber, an inert gas being supplied to the process chamber through the inert gas supply pipe; a first heating system configured to heat the substrate; a second heating system installed at the inert gas supply pipe and configured to heat the inert gas; and a controller configured to control the precursor gas supply system, the reaction gas supply system, the inert gas supply system, the first heating system, and the second heating system such that a precursor gas supply process of supplying the precursor gas to the process chamber while maintaining the substrate accommodated in the process chamber at a first temperature; a first removal process of removing the precursor gas remaining in the process chamber by supplying the inert gas, which is heated at a second temperature higher than the first temperature, to the process chamber; a reaction gas supply process of supplying the reaction gas to the process chamber; and a second removal process of removing the reaction gas remaining in the process chamber by supplying the inert gas to the process chamber are performed in sequence.

<Supplementary Note 8>

In the substrate processing apparatus according to Supplementary Note 7, the reaction gas supply system has a reaction gas supply pipe connected to the process chamber, the reaction gas being supplied to the process chamber through the reaction gas supply pipe, wherein a third heating system configured to heat the reaction gas is installed in the reaction gas supply pipe, and wherein the control part is configured to control the third heating system such that, in the reaction gas supply process, the reaction gas heated at a third temperature higher than the first temperature is supplied to the process chamber.

<Supplementary Note 9>

According to an aspect of the present disclosure, there is provided a program that causes a computer to perform in sequence the processes of: supplying a precursor gas to a process chamber while maintaining a substrate accommodated in the process chamber at a first temperature; removing the precursor gas remaining in the process chamber by supplying an inert gas, which is heated at a second temperature higher than the first temperature, to the process chamber; supplying a reaction gas to the process chamber; and removing the reaction gas remaining in the process chamber by supplying an inert gas to the process chamber.

<Supplementary Note 10>

According to an aspect of the present disclosure, there is provided a non-transitory computer-readable recording medium storing a program that causes a computer to perform in sequence the processes of: supplying a precursor gas to a process chamber while maintaining a substrate accommodated in the process chamber at a first temperature; removing the precursor gas remaining in the process chamber by supplying an inert gas, which is heated at a second temperature higher than the first temperature, to the process chamber; supplying a reaction gas to the process chamber; and removing the reaction gas remaining in the process chamber by supplying an inert gas to the process chamber.

<Supplementary Note 11>

According to an aspect of the present disclosure, there is provided a substrate processing apparatus, including: a precursor gas supply part configured to supply a precursor gas; a reaction gas supply part configured to supply a reaction gas and a carrier gas, and having a heating part configured to heat the reaction gas and/or carrier gas; a substrate process chamber having a process space in which a substrate is processed, the substrate process chamber being connected to the precursor gas supply part and reaction gas supply part; and a control part, wherein the control part is configured to control such that a purge process is performed by supplying the carrier gas in a state heated by heating part when remnants of the precursor gas are removed after the precursor gas is supplied to the process chamber.

<Supplementary Note 12>

In the substrate processing apparatus according to Supplementary Note 11, when the reaction gas is supplied, the reaction gas is supplied at a temperature equal to or higher than a pyrolysis temperature.

<Supplementary Note 13>

In the substrate processing apparatus according to Supplementary Note 11, the reaction gas supply part includes a reaction gas supply pipe connected to a reaction gas source and a carrier gas supply pipe connected to a carrier gas source, and a heater is installed between the process chamber and a connection part of the reaction gas supply pipe and the carrier gas supply pipe.

<Supplementary Note 14>

In the substrate processing apparatus according to Supplementary Note 13, a second heater configured to maintain a temperature of the heated gas is installed between the heater and the process chamber.

<Supplementary Note 15>

In the substrate processing apparatus according to any one of Supplementary Notes 11 to 14, when the reaction gas is supplied to exhaust the remnants, a purge gas is supplied such that a temperature of the substrate is lower than a pyrolysis temperature of the reaction gas.

<Supplementary Note 16>

According to an aspect of the present disclosure, there is provided a batch type substrate processing apparatus in which a precursor gas supply region, a first purge region, a reaction gas supply region, and a second purge region are arranged in this order along a rotation direction, wherein heating heaters are installed in each of a reaction gas supply part configured to supply a gas to the reaction gas supply region and a first purge gas supply part configured to supply a purge gas to the first purge region.

INDUSTRIAL APPLICABILITY

A temperature of a substrate, which is heated by a susceptor heater, is set to a temperature appropriate for an adsorption reaction of a film-forming precursor gas, and further a reaction gas is heated and supplied, thereby applying a thermal energy, which is required for a film forming reaction, to a film forming surface of the substrate.

What is claimed is:

1. A substrate processing apparatus comprising:
   a process chamber configured to accommodate a substrate; and
   a gas supply system configured to supply process gases, which include a reaction gas, a precursor gas, a first inert gas and a second inert gas, into the process chamber,
   the gas supply system including a common gas supply pipe communicating with the process chamber, a heating system configured to heat the reaction gas and the first inert gas, a reaction gas supply pipe connected to the common gas supply pipe and configured to supply the reaction gas into the process chamber, a first inert gas supply pipe connected to the reaction gas supply pipe and configured to supply the first inert gas into the process chamber, a precursor gas supply pipe connected to the common gas supply pipe in an downstream side of the heating system and configured to supply the precursor gas into the process chamber, and a second inert gas supply pipe connected to the precursor gas supply pipe and configured to supply the second inert gas into the process chamber.

2. The apparatus of claim 1, wherein the heating system includes a first heating part installed in the reaction gas supply pipe and a second heating part installed to cover at least a part of the common gas supply pipe.

3. The apparatus of claim 2, wherein the gas supply system further includes a third inert gas supply pipe connected to the reaction gas supply pipe in a position where the second heating part is installed and configured to supply a third inert gas, and wherein the heating system further includes a third heating part installed in the third inert gas supply pipe.

4. The apparatus of claim 3, wherein the third heating part is installed to cover at least a part of the third inert gas supply pipe.

5. The apparatus of claim 4, wherein the gas supply system further includes a cleaning gas supply pipe connected to the third inert gas supply pipe in a downstream side of the third heating part and configured to supply a cleaning gas into the process chamber.

6. The apparatus of claim 1, further comprising a controller configured to control the gas supply system to heat the reaction gas supply pipe by the heating system at a temperature higher than that of the common gas supply pipe.

7. The apparatus of claim 6, wherein a heating part configured to heat the common gas supply pipe is installed in the common gas supply pipe in a downstream side of a connecting portion between the common gas supply pipe and the reaction gas supply pipe.

8. The apparatus of claim 1, further comprising a control part configured to control the gas supply system to sequentially perform:
- supplying the precursor gas from the precursor gas supply pipe to the substrate accommodated in the process chamber via the common gas supply pipe while maintaining the substrate at a first temperature;
- supplying the first inert gas, which is heated by the heating system at a second temperature higher than the first temperature, from the first inert gas supply pipe to the substrate via the reaction gas supply pipe and the common gas supply pipe;
- supplying the reaction gas from the reaction gas supply pipe to the substrate via the common gas supply pipe; and
- supplying the second inert gas from the second inert gas supply pipe to the substrate via the precursor gas supply pipe and the common gas supply pipe.

\* \* \* \* \*